US012191413B2

(12) United States Patent
Yamashita et al.

(10) Patent No.: US 12,191,413 B2
(45) Date of Patent: Jan. 7, 2025

(54) SOLAR BATTERY MODULE AND TANDEM SOLAR BATTERY

(71) Applicants: KABUSHIKI KAISHA TOSHIBA, Tokyo (JP); TOSHIBA ENERGY SYSTEMS & SOLUTIONS CORPORATION, Kawasaki (JP)

(72) Inventors: Katsuya Yamashita, Kawasaki Kanagawa (JP); Haiyan Jin, Kawasaki Kanagawa (JP); Miyuki Shiokawa, Kawasaki Kanagawa (JP); Takeshi Gotanda, Yokohama Kanagawa (JP); Tomohiro Tobari, Yokohama Kanagawa (JP); Yutaka Saita, Yokohama Kanagawa (JP)

(73) Assignees: KABUSHIRI KAISHA TOSHIBA, Tokyo (JP); TOSHIBA ENERGY SYSTEMS & SOLUTIONS CORPORATION, Kawasaki (JP)

( * ) Notice: Subject to any disclaimer, the term of this patent is extended or adjusted under 35 U.S.C. 154(b) by 208 days.

(21) Appl. No.: 17/573,666

(22) Filed: Jan. 12, 2022

(65) Prior Publication Data
US 2022/0140165 A1 May 5, 2022

Related U.S. Application Data

(63) Continuation of application No. PCT/JP2019/028079, filed on Jul. 17, 2019.

(51) Int. Cl.
*H01L 31/046* (2014.01)
*H01L 31/02* (2006.01)
(Continued)

(52) U.S. Cl.
CPC ...... *H01L 31/046* (2014.12); *H01L 31/02008* (2013.01); *H01L 31/0443* (2014.12); *H01L 31/048* (2013.01)

(58) Field of Classification Search
CPC ............. H01L 31/046; H01L 31/02008; H01L 31/0443; H01L 31/048; H01L 31/042;
(Continued)

(56) References Cited

U.S. PATENT DOCUMENTS

2006/0162768 A1* 7/2006 Wanlass ................ H01L 31/046
257/E27.125
2010/0147364 A1* 6/2010 Gonzalez ............. H01L 31/044
136/251
2011/0108084 A1 5/2011 Tisler et al.

FOREIGN PATENT DOCUMENTS

JP 2013-038323 2/2013
JP 2013-143529 7/2013
(Continued)

OTHER PUBLICATIONS

English machine translation of Hamada JP 2013143529 (Year: 2024).*
(Continued)

*Primary Examiner* — Angelo Trivisonno
(74) *Attorney, Agent, or Firm* — Amin, Turocy & Watson, LLP

(57) ABSTRACT

A solar battery module according to an embodiment has at least one solar battery panel, a flexible substrate and a package. A solar battery cell is formed in the at least one solar battery panel. The flexible substrate is directly or indirectly connected to the at least one solar battery panel. A bypass diode is mounted on the flexible substrate. The flexible substrate forms a bypass line of the at least one solar battery panel. The package accommodates the at least one solar battery panel. The flexible substrate has a base material
(Continued)

and a wiring. The wiring is supported by the base material. The wiring has a flying lead and a terminal. The flying lead protrudes from the base material. The flying lead is connected to the at least one solar battery panel. The terminal is provided on an outward side of the package.

6 Claims, 8 Drawing Sheets

(51) Int. Cl.
*H01L 31/0443* (2014.01)
*H01L 31/048* (2014.01)
(58) Field of Classification Search
CPC . H01L 31/043; H01L 31/044; H01L 31/0516; Y02E 10/50
See application file for complete search history.

(56) References Cited

FOREIGN PATENT DOCUMENTS

| | | | |
|---|---|---|---|
| JP | 2013143529 A * | 7/2013 | |
| JP | 2013-153076 | 8/2013 | |
| JP | 3220083 | 2/2019 | |
| JP | 2019-102620 | 6/2019 | |
| WO | WO-0120686 A1 * | 3/2001 | ............ B64G 1/443 |
| WO | 2018/056091 | 3/2018 | |

OTHER PUBLICATIONS

International Search Report and Written Opinion for International Application No. PCT/JP2019/028079 mailed on Oct. 1, 2019, 14 pgs.

* cited by examiner

SOLAR BATTERY MODULE AND TANDEM SOLAR BATTERY

CROSS-REFERENCE TO RELATED APPLICATION

This is a Continuation Application of International Application No. PCT/JP2019/028079, filed on Jul. 17, 2019, and the entire contents of the aforementioned application are incorporated herein by reference.

FIELD

Embodiments described herein relate generally to a solar battery module and a tandem solar battery.

BACKGROUND

Generally, as a bypass for a current, a bypass line is connected to a solar battery panel in which a solar battery cell is formed. For example, a bypass line includes a bypass diode which is disposed in a junction box, and a bus bar which connects the solar battery panel and the bypass diode to each other. However, installation of a bypass line may hinder the weight reduction of an entire system.

DETAILED DESCRIPTION

A solar battery module according to an embodiment has at least one solar battery panel, a flexible substrate and a package. A solar battery cell is formed in the at least one solar battery panel. The flexible substrate is directly or indirectly connected to the at least one solar battery panel. A bypass diode is mounted on the flexible substrate. The flexible substrate forms a bypass line of the at least one solar battery panel. The package accommodates the at least one solar battery panel. The flexible substrate has a base material and a wiring. The wiring is supported by the base material. The wiring has a flying lead and a terminal. The flying lead protrudes from the base material. The flying lead is connected to the at least one solar battery panel. The terminal is provided on an outward side of the package.

Hereinafter, a solar battery module and a tandem solar battery according to an embodiment will be described with reference to the drawings. In the following description, the same reference signs are applied to constituent elements having functions which are the same or similar. Further, duplicate descriptions of the constituent elements may be omitted.

Figure 1:
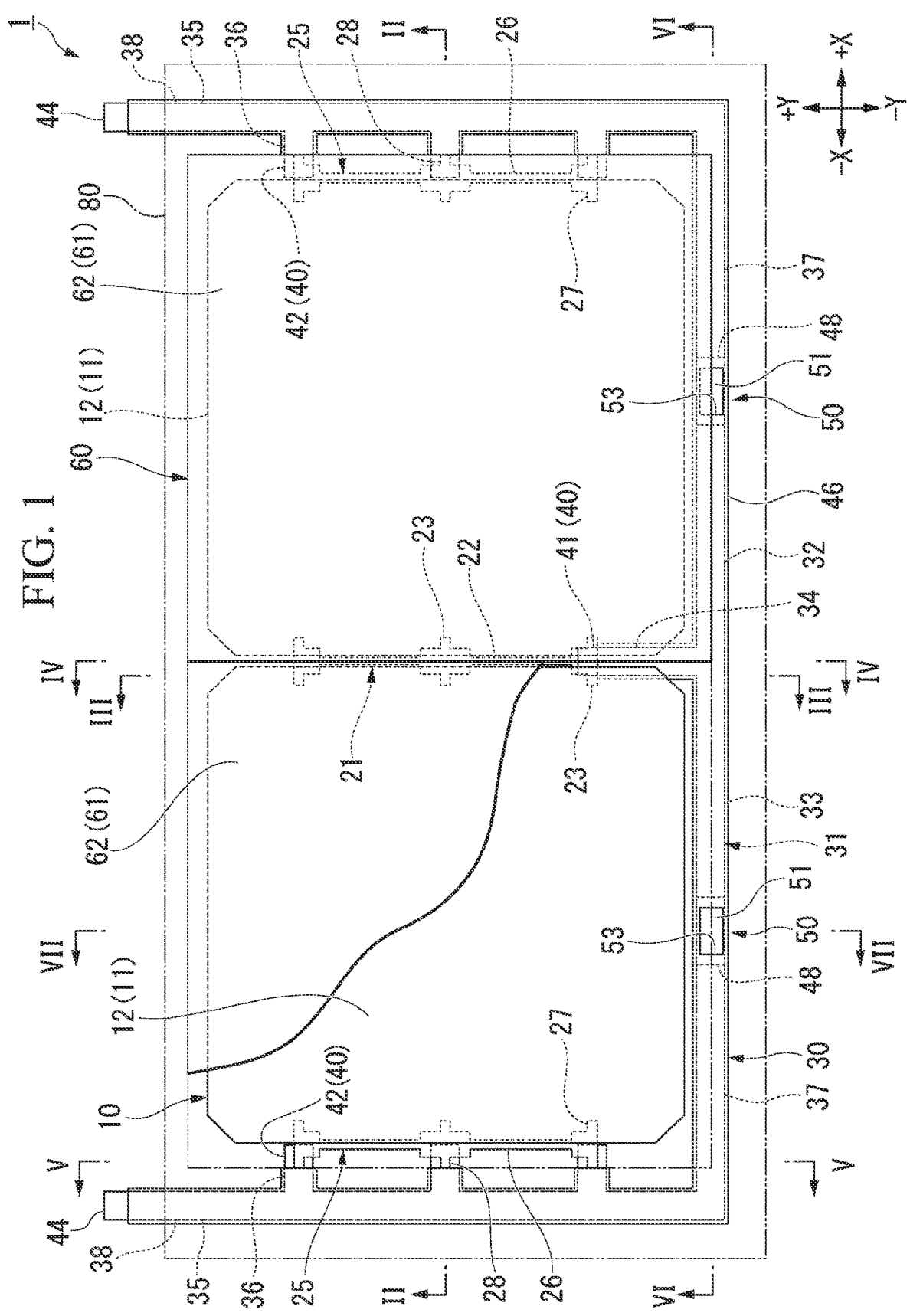
FIG. 1 is a plan view illustrating a tandem solar battery according to an embodiment.
Figure 2:
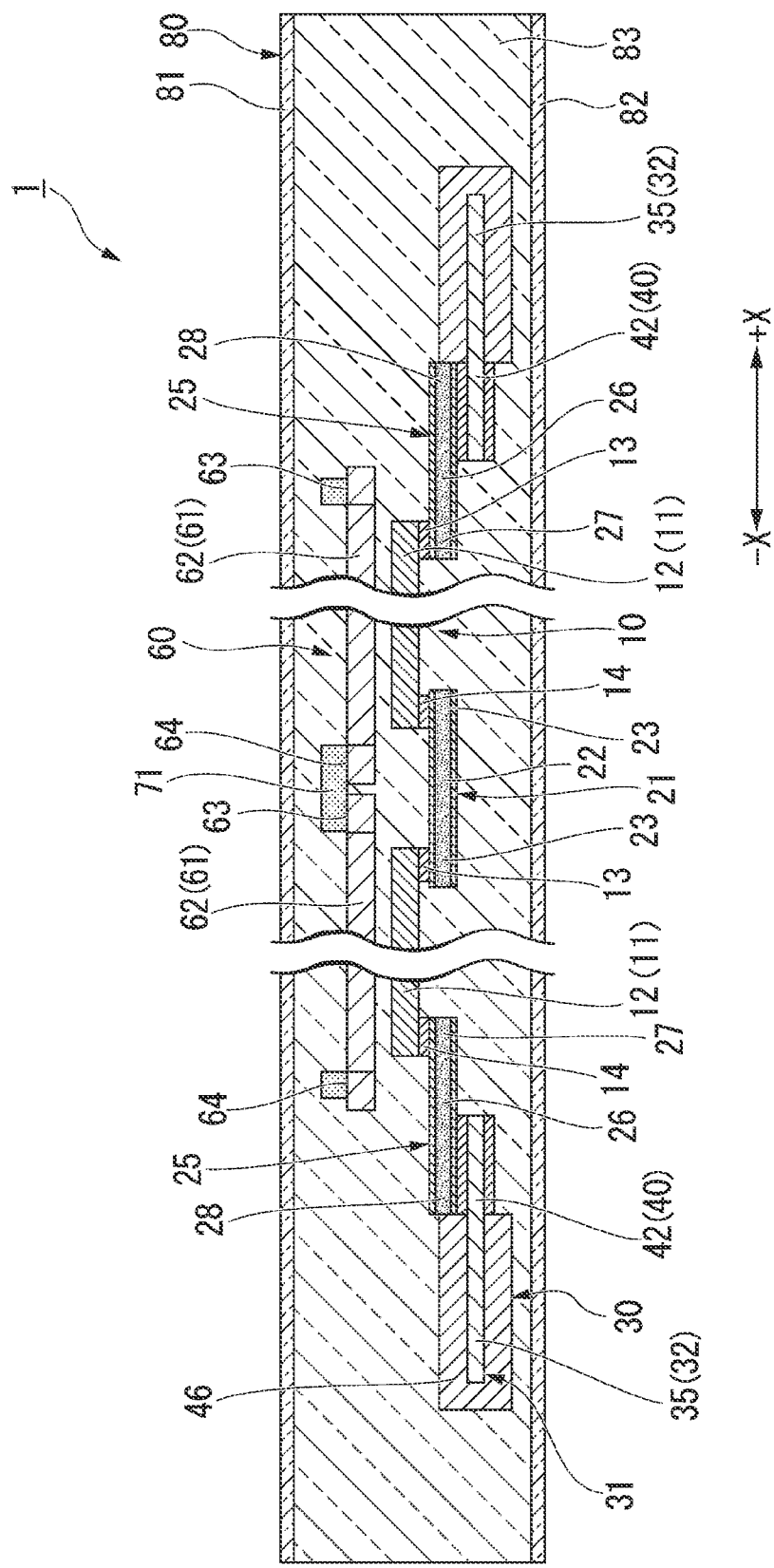
FIG. 2 is a cross-sectional view along line II-II of FIG. 1.

FIG. 1 is a plan view illustrating a tandem solar battery according to the embodiment. FIG. 2 is a cross-sectional view along line II-II of FIG. 1. In FIG. 1, part of a top module 60 (which will be described below) and a package 80 are indicated by imaginary lines.

As illustrated in FIGS. 1 and 2, a tandem solar battery 1 includes a bottom module 10 (a solar battery module, a first solar battery module) including solar battery cells 12 constituting back cells, the top module 60 (a solar battery module, a second solar battery module) including solar battery cells 62 constituting front cells, and the package 80 accommodating the bottom module 10 and the top module 60.

Here, for the sake of convenience of description, a +X direction, a −X direction, a +Y direction, and a −Y direction will be defined. The −X direction is a direction opposite to the +X direction. When the +X direction and the −X direction are not distinguished from each other, they will be simply referred to as an "X direction". The +Y direction and the −Y direction are orthogonal to the X direction. The −Y direction is a direction opposite to the +Y direction. When the +Y direction and the −Y direction are not distinguished from each other, they will be simply referred to as a "Y direction". In addition, one direction orthogonal to the X direction and the Y direction will be defined as a "front side", and a direction opposite to the front side will be defined as a "rear side".

The bottom module 10 has a pair of bottom solar battery panels 11 (solar battery panels), an inter-panel connector 21 connecting the pair of bottom solar battery panels 11 to each other, a pair of panel end connectors 25 connected to the respective bottom solar battery panels 11, and a flexible substrate 30 forming a bypass line of each of the bottom solar battery panels 11. The pair of bottom solar battery panels 11 are provided side by side in the X direction. The pair of bottom solar battery panels 11 are connected to each other in series. Each of the bottom solar battery panels 11 has a rectangular shape in which a pair of sides extend in the X direction and the remaining pair of sides extend in the Y direction in the plan view. In the present embodiment, each of the bottom solar battery panels 11 has a square shape in the plan view.

At least one solar battery cell 12 is formed in each of the bottom solar battery panels 11. In each of the bottom solar battery panels 11, a single solar battery cell 12 may be formed or a plurality of solar battery cells 12 connected in series and parallel to each other may be formed. For example, the solar battery cells 12 are silicon-based solar battery cells of light absorption layers using Si. The solar battery cells 12 are back-contact-type solar battery cells each having an n-type electrode and a p-type electrode on the rear side of the light absorption layer. In each of the bottom solar battery panels 11, a light receiving surface faces the front side.

Figure 3:
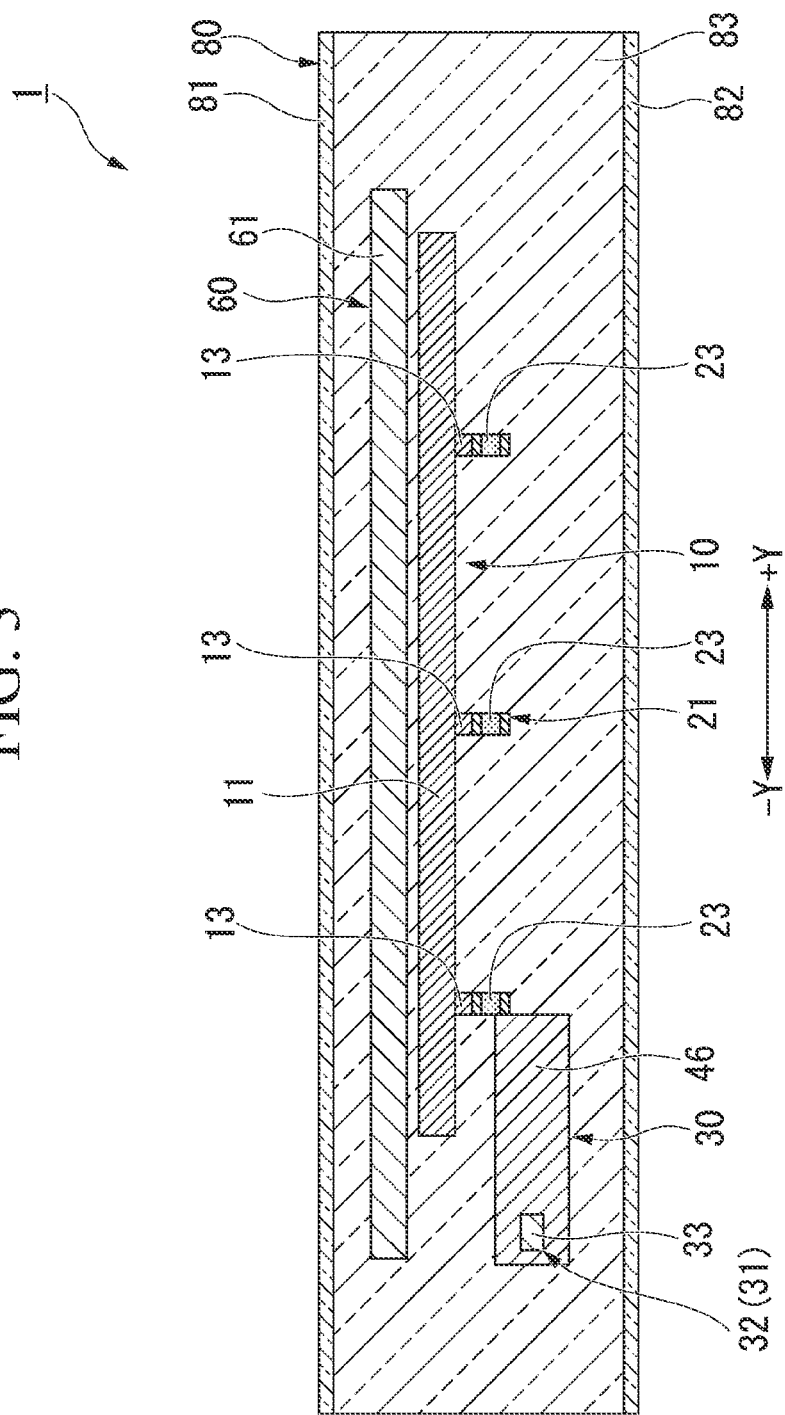
FIG. 3 is a cross-sectional view along line of FIG. 1.

As illustrated in FIG. 2, each of the bottom solar battery panels 11 includes a first terminal 13 electrically connected to one of the n-type electrode and the p-type electrode, and a second terminal 14 electrically connected to the other of the n-type electrode and the p-type electrode. The first terminals 13 are provided at end portions of the bottom solar battery panels 11 in the +X direction. The first terminals 13 are provided on rear surfaces of the bottom solar battery panels 11. Three first terminals 13 are provided side by side in the Y direction (refer to FIG. 3). The second terminals 14 are provided at end portions of the bottom solar battery panels 11 on sides opposite to the first terminals 13. The second terminals 14 are provided on the rear surfaces of the bottom solar battery panels 11. A plurality of second terminals 14 are provided at positions overlapping a plurality of first terminals 13 when viewed in the X direction. Namely, three second terminals 14 are provided side by side in the Y direction. However, the number of first terminals 13 and second terminals 14 is not particularly limited.

As illustrated in FIGS. 1 and 2, the inter-panel connector 21 connects the pair of bottom solar battery panels 11 to each other in series. The inter-panel connector 21 is formed using a metal plate having solder-plated layers on both main surfaces. The inter-panel connector 21 is connected to the first terminal 13 of one bottom solar battery panel 11 and the second terminal 14 of the other bottom solar battery panel 11. The inter-panel connector 21 is formed of a single member and is connected to all of the first terminals 13 of the one bottom solar battery panel 11 and all of the second terminals 14 of the other bottom solar battery panel 11. The inter-panel connector 21 includes a main body portion 22 extending in the Y direction between the pair of bottom solar battery panels 11 in the plan view, and terminal joint portions 23 extending in the X direction from the main body portion 22 and joined to the first terminal 13 or the second terminal 14 of the bottom solar battery panel 11. However, the inter-panel connector may be constituted of a plurality of members which are connected to the first terminal 13 of the one bottom solar battery panel 11 and the second terminal 14 of the other bottom solar battery panel 11 one each.

The pair of panel end connectors 25 are connected to terminals, of the first terminals 13 and the second terminals 14 in each of the bottom solar battery panels 11, to which the inter-panel connector 21 is not connected. Namely, when the pair of bottom solar battery panels 11 connected to each other in series are regarded as one solar battery, the pair of panel end connectors 25 are connected to the first terminal 13 and the second terminal 14 which become electrical end portions of the one solar battery. The pair of panel end connectors 25 are formed using metal plates having solder-plated layers on both main surfaces. One panel end connector 25 is connected to all of the second terminals 14 of one bottom solar battery panel 11. The other panel end connector 25 is connected to all of the first terminals 13 of the other bottom solar battery panel 11.

Each of the panel end connectors 25 includes a main body portion 26 extending in the Y direction, a terminal joint portion 27 extending in the X direction from the main body portion 26 and joined to the first terminal 13 or the second terminal 14 of the bottom solar battery panel 11, and a lead joint portion 28 extending to the side opposite to the terminal joint portion 27 from the main body portion 26 and joined to a flying lead 40 which will be described below. The lead joint portion 28 is provided at a position overlapping the terminal joint portion 27 when viewed in the X direction. The lead joint portion 28 is disposed on an outward side of the bottom solar battery panel 11 in the plan view. In the present embodiment, the panel end connectors 25 have the same shape as the inter-panel connector 21.

As illustrated in FIG. 1, the flexible substrate 30 is disposed such that the pair of bottom solar battery panels 11 in their entirety are surrounded in three directions excluding the +Y direction in the plan view. The flexible substrate 30 is indirectly connected to the pair of bottom solar battery panels 11. The flexible substrate 30 includes a wiring 31, a base material 46 supporting the wiring 31, and reinforcement members 48 reinforcing the base material 46.

For example, the wiring 31 is formed of a copper foil or the like. The wiring 31 includes a wiring main body 32 overlapping the base material 46 in the plan view, and a plurality of flying leads 40 and a pair of terminals 44 protruding from the base material 46. The wiring main body 32 includes a first main line portion 33 disposed along outer edges of the respective bottom solar battery panels 11 in the −Y direction in the plan view, a first branch line portion 34 extending from the first main line portion 33 to the bottom solar battery panel 11 side in the plan view, a pair of second main line portions 35 disposed along outer edges of the respective bottom solar battery panels 11 on both sides in the X direction in the plan view, and second branch line portions 36 extending from the respective second main line portions 35 to the bottom solar battery panel 11 side in the plan view.

The first main line portion 33 is disposed on the outward side of the entire pair of bottom solar battery panels 11 in the Y direction in the plan view. The first main line portion 33 extends in the X direction. Both end portions of the first main line portion 33 are positioned on the outward side of the entire pair of bottom solar battery panels 11 in the X direction. The first branch line portion 34 extends in the Y direction. The first branch line portion 34 is provided at the same position as the inter-panel connector 21 in the Y direction. The first branch line portion 34 extends from an intermediate portion of the first main line portion 33 to a portion on a side in front of the inter-panel connector 21 in the plan view.

Each of the second main line portions 35 is disposed on the outward side of the pair of bottom solar battery panels 11 in their entirety in the X direction in the plan view. Each of the second main line portions 35 extends in the Y direction. Both end portions of each of the second main line portions 35 are positioned on the outward sides of the pair of bottom solar battery panels 11 in their entirety in the Y direction. The end portion of each of the second main line portions 35 in the −Y direction is connected to the end portion of the first main line portion 33. The second branch line portions 36 extend in the X direction. The second branch line portions 36 are provided at the same positions as the lead joint portions 28 of the panel end connectors 25 in the X direction. The second branch line portions 36 extend from the respective second main line portions 35 to portions on the side in front of the panel end connectors 25.

The plurality of flying leads 40 are integrally formed with the wiring main body 32. Each of the flying leads 40 extends from the wiring main body 32 with a uniform width in the plan view. For example, each of the flying leads 40 has a copper foil extending from the wiring main body 32, silver-plated layers laminated on both main surfaces of the copper foil, and gold-plated layers laminated on the silver-plated layers.

Figure 4:
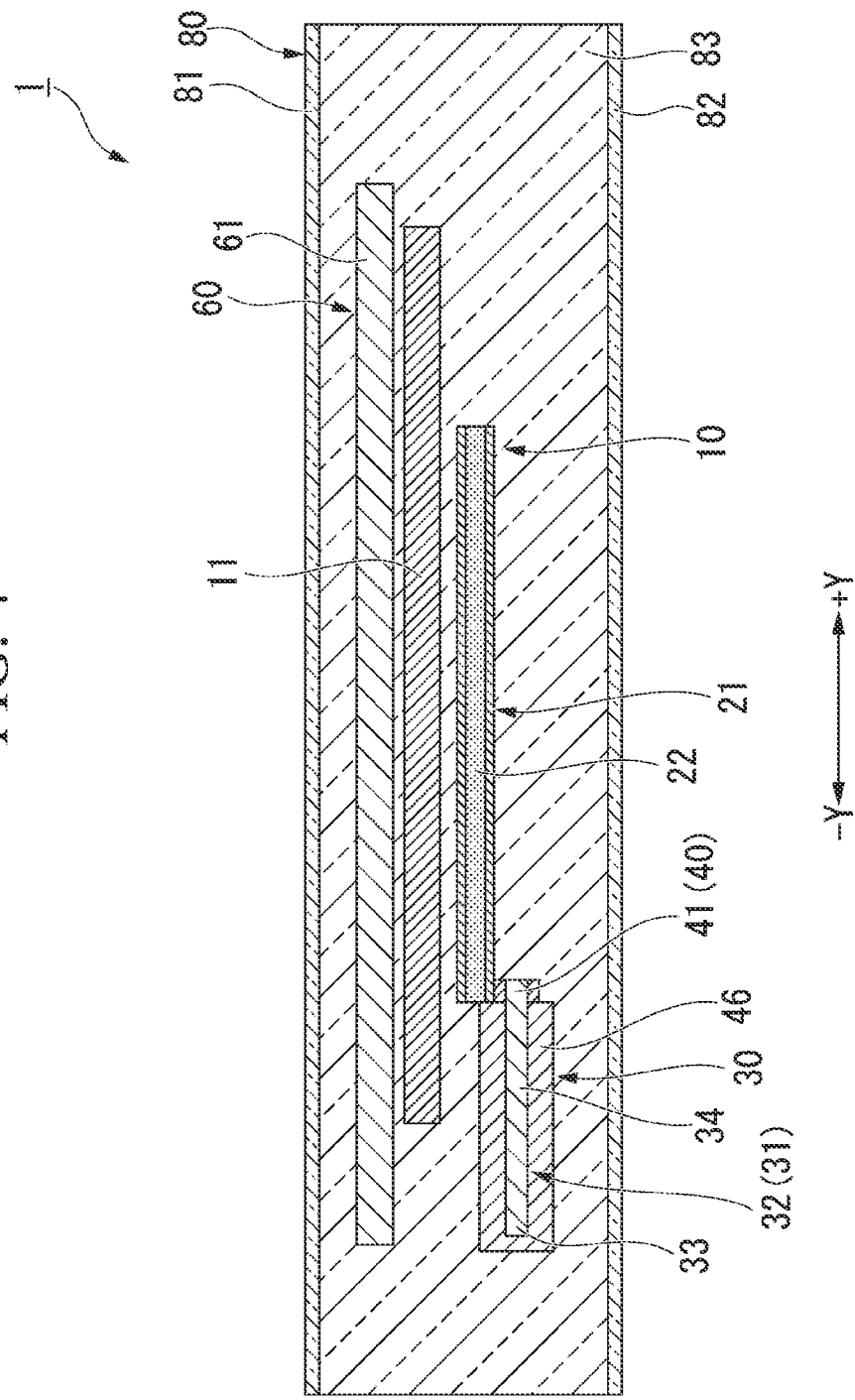
FIG. 4 is a cross-sectional view along line IV-IV of FIG. 1.
Figure 5:
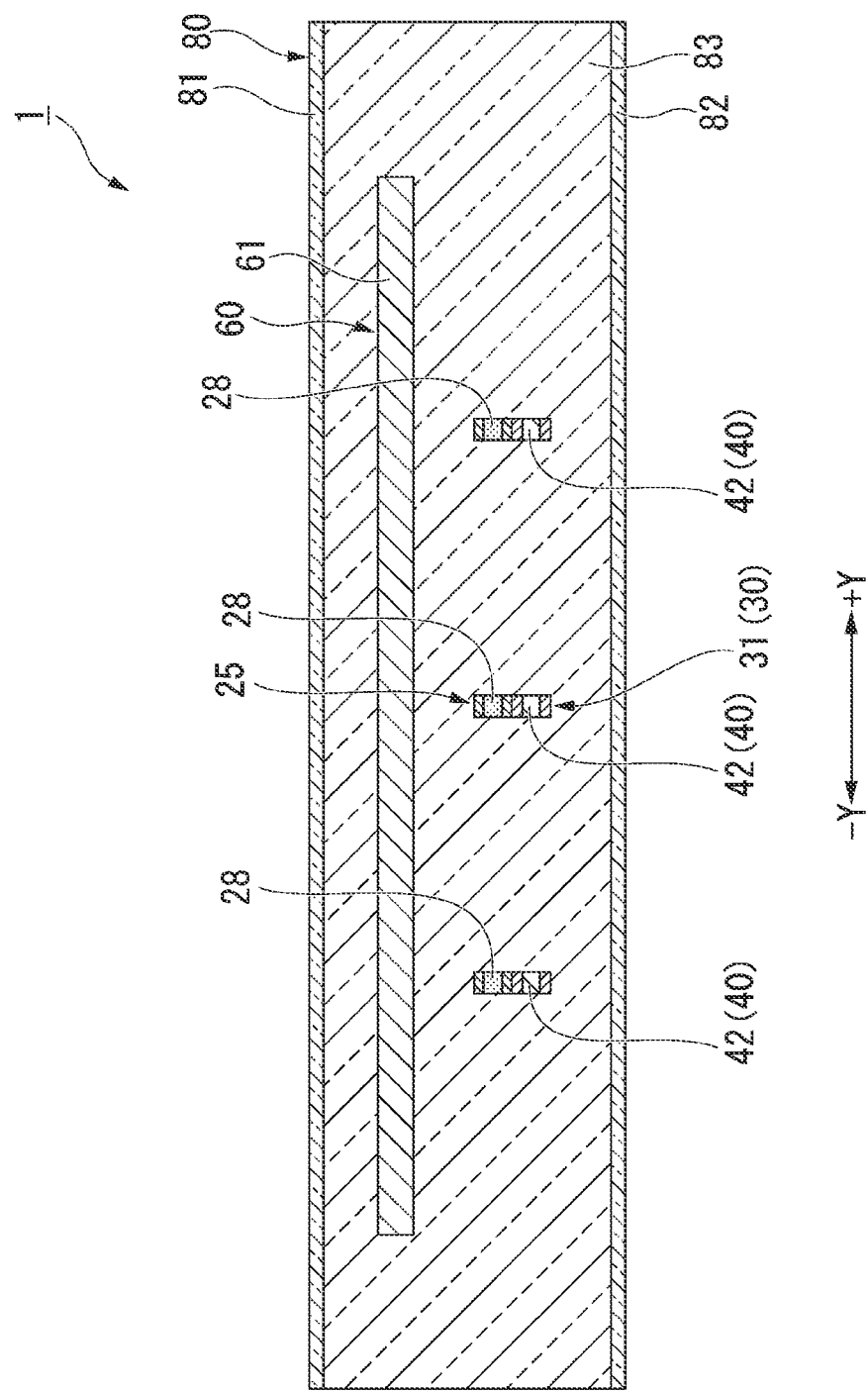
FIG. 5 is a cross-sectional view along line V-V of FIG. 1.

The plurality of flying leads 40 are indirectly connected to the bottom solar battery panels 11. The plurality of flying leads 40 include a first lead portion 41 joined to the inter-panel connector 21, and second lead portions 42 joined to the panel end connectors 25. The first lead portion 41 extends inward in the Y direction from the first branch line portion 34 of the wiring main body 32. The first lead portion 41 overlaps the end portion of the inter-panel connector 21 in the −Y direction in the plan view. The first lead portion 41 is directly joined to a rear surface of the end portion of the inter-panel connector 21 (refer to FIG. 4). The second lead portions 42 extend inward in the X direction from the second branch line portions 36 of the wiring main body 32. The second lead portions 42 overlap the lead joint portions 28 of the panel end connectors 25 in the plan view. The second lead portions 42 are directly joined to rear surfaces of the lead joint portions 28 of the panel end connectors 25 (also refer to FIG. 5).

The pair of terminals 44 are provided as terminals for taking out currents in the bottom module 10 in its entirety.

The pair of terminals 44 are integrally formed with the wiring main body 32. Similar to the flying leads 40, each of the terminals 44 has a copper foil extending from the wiring main body 32, silver-plated layers laminated on both main surfaces of the copper foil, and gold-plated layers laminated on the silver-plated layers. The pair of terminals 44 extend outward in the X direction from the end portions of each of the second main line portions 35 on a side opposite to connection portion between the second main line portions 35 and the first main line portion 33.

In terms of functional classification, the wiring 31 includes a pair of bypass portions 37 forming bypass lines of the respective bottom solar battery panels 11, and a pair of output portions 38 branching from the bypass lines and forming output lines of the bottom module 10. Each of the bypass portions 37 has the first lead portion 41, the first branch line portion 34, single first main line portion 33, single second main line portion 35 connected to the first main line portion 33, the second branch line portion 36 connected to the second main line portion 35, and the second lead portion 42 extending from the second branch line portion 36. Each of the output portions 38 connects the bottom solar battery panel 11 and each of the terminals 44 to each other. Each of the output portions 38 has the second main line portion 35, the terminal 44 extending from the second main line portion 35, the second branch line portion 36 connected to the second main line portion 35, and the second lead portion 42 extending from the second branch line portion 36.

The base material 46 is formed of an insulating material such as polyimide or the like having a sheet shape. The base material 46 covers both the main surfaces of the wiring main body 32 in their entirety excluding mounting portions 50 (which will be described below). The outer edge of the base material 46 has a uniform interval with respect to the outer edge of the wiring main body 32 excluding the connection portions of the wiring main body 32 with respect to the flying leads 40 and the terminals 44. The base material 46 is disposed on the outward side of the entire pair of bottom solar battery panels 11 in the plan view excluding a part covering the first branch line portion 34 of the wiring main body 32.

Here, prior to description of the reinforcement members 48, the mounting portions 50 formed in the flexible substrate 30 will be described.

As many mounting portions 50 as the bottom solar battery panels 11 are provided. The mounting portions 50 are parts where bypass diodes 51 (which will be described below) are mounted.

Figure 6:
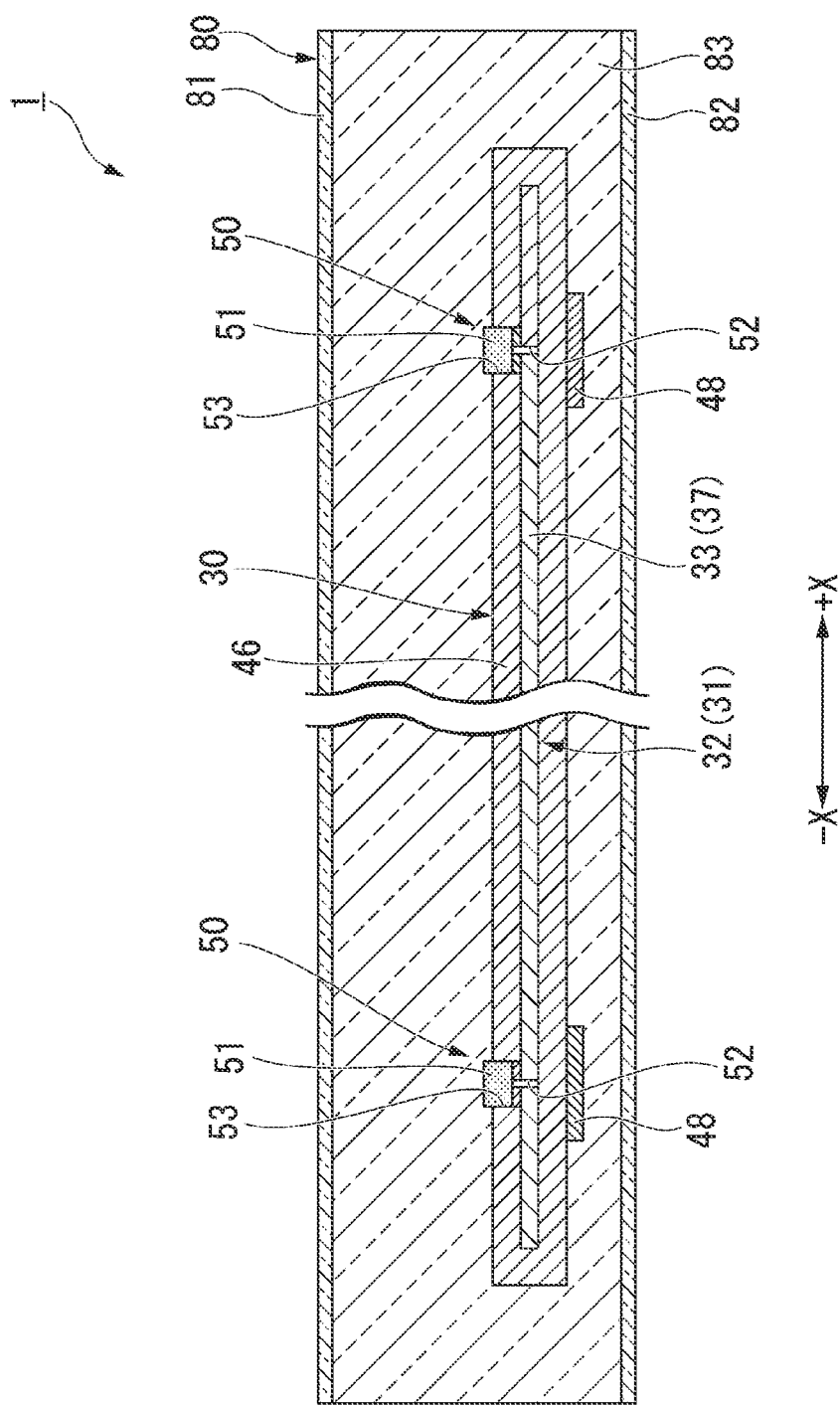
FIG. 6 is a cross-sectional view along line VI-VI of FIG. 1.
Figure 7:
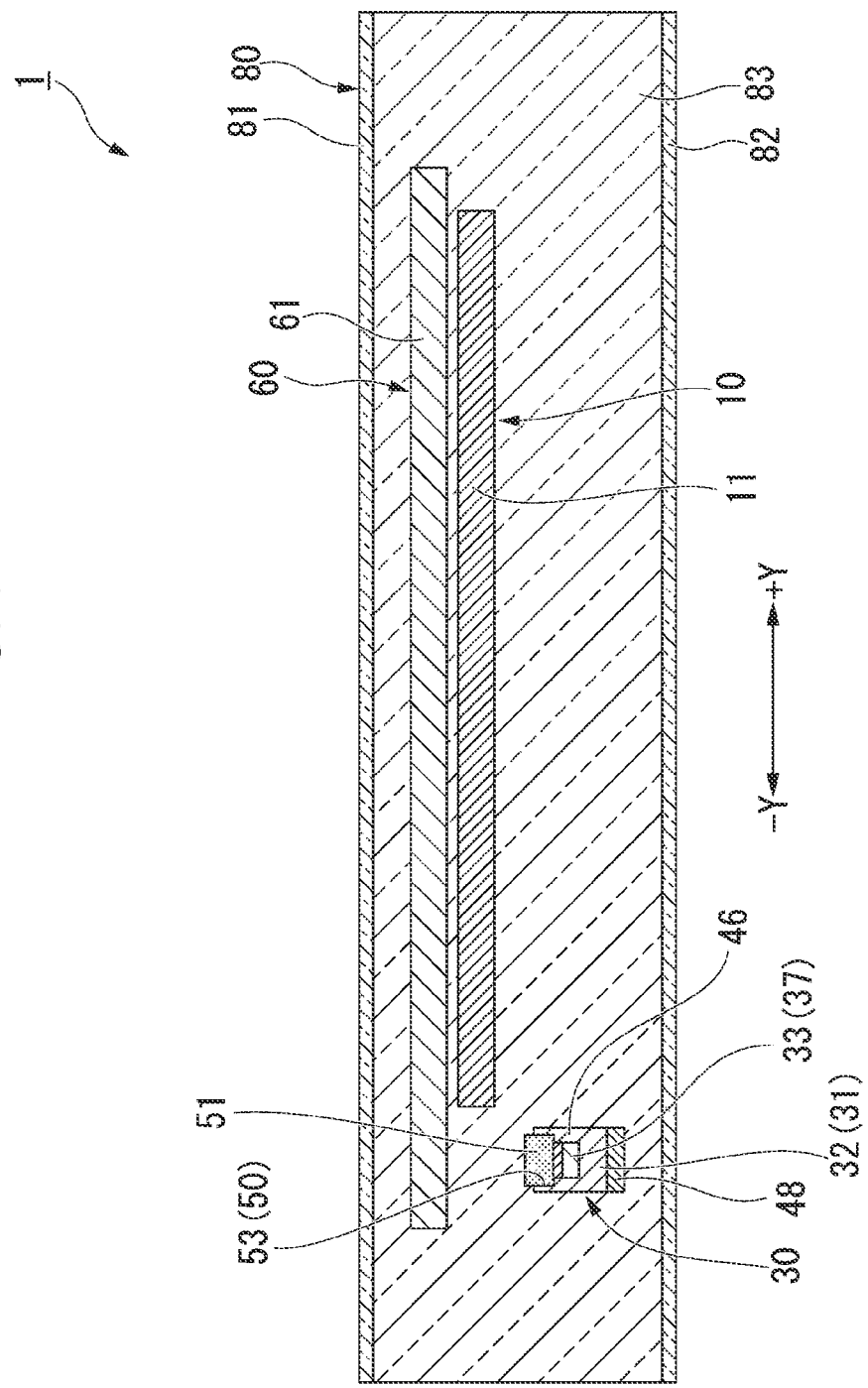
FIG. 7 is a cross-sectional view along line VII-VII of FIG. 1.

FIG. 6 is a cross-sectional view along line VI-VI of FIG. 1. FIG. 7 is a cross-sectional view along line VII-VII of FIG. 1.

As illustrated in FIGS. 6 and 7, each of the mounting portions 50 includes a dividing portion 52 formed in the wiring main body 32, and a window portion 53 formed in the base material 46 and exposing the wiring main body 32. The dividing portion 52 is formed in the bypass portion 37 of the wiring main body 32. More specifically, the dividing portion 52 is formed in the first main line portion 33 of the wiring main body 32. The dividing portion 52 causes both portions sandwiching the dividing portion 52 therebetween in the wiring main body 32 to be insulated from each other. For example, the dividing portion 52 is formed through etching. The window portion 53 exposes both portions sandwiching the dividing portion 52 therebetween in the wiring main body 32 to the front side. However, the window portion 53 may expose the wiring main body 32 to the rear side. In the present embodiment, the window portion 53 collectively exposes both portions sandwiching the dividing portion 52 in the wiring main body 32 therebetween.

Each of the bypass diodes 51 is disposed on an inward side of the window portion 53. The bypass diode 51 in its entirety is positioned on the outward side of the bottom solar battery panel 11 in the plan view (refer to FIG. 1). The bypass diode 51 is connected to both portions sandwiching the dividing portion 52 in the wiring main body 32 therebetween. The bypass diode 51 is connected to each of the bottom solar battery panels 11 in parallel. The bypass diodes 51 rectify the bypass portions 37 of the wiring main body 32.

The reinforcement members 48 are disposed at positions overlapping the mounting portions 50 in the plan view. The reinforcement members 48 are formed of the same material as the base material 46. The reinforcement members 48 have sheet shapes. The reinforcement members 48 are joined to the base material 46. The reinforcement members 48 are disposed on a side opposite to the window portion 53 with the wiring main body 32 sandwiched therebetween. The reinforcement members 48 overlap at least the dividing portion 52 and the window portion 53 in their entirety in the plan view. The reinforcement members 48 may be formed of materials different from that of the base material 46. However, it is desirable that the reinforcement members 48 be formed of insulating materials.

As illustrated in FIGS. 1 and 2, the top module 60 is disposed on the front side of the bottom module 10. The top module 60 has a pair of top solar battery panels 61 (solar battery panels). The pair of top solar battery panels 61 are provided side by side in the X direction. The pair of top solar battery panels 61 are connected to each other in series. Each of the top solar battery panels 61 has a rectangular shape in which a pair of sides extend in the X direction and the remaining pair of sides extend in the Y direction in the plan view. In the present embodiment, each of the top solar battery panels 61 has a square shape in the plan view. Each of the top solar battery panels 61 is laminated at a position facing the light receiving surface of the bottom solar battery panel 11 of the bottom module 10. The top solar battery panels 61 are larger than the bottom solar battery panels 11 in the X direction and the Y direction. The top solar battery panels 61 overlap the bottom solar battery panels 11 in their entirety in the plan view. Namely, outer edges of the top solar battery panels 61 are positioned on the outward side of the bottom solar battery panels 11 in the plan view.

At least one solar battery cell 62 is formed in the top solar battery panels 61. In the top solar battery panels 61, a single solar battery cell 62 may be formed or a plurality of solar battery cells 62 connected in series and parallel to each other may be formed. The solar battery cells 62 are transmission-type solar battery cells. The solar battery cells 62 have light absorption layers having a wider bandgap than the light absorption layers of the solar battery cells 12 of the bottom module 10. For example, the light absorption layers of the solar battery cells 62 contain $Cu_2O$. The solar battery cells 62 overlap the solar battery cells 12 of the bottom solar battery panels 11 in their entirety in the plan view. In the present embodiment, the solar battery cells 62 overlap the bottom solar battery panels 11 in their entirety in the plan view.

As illustrated in FIG. 2, similar to the bottom solar battery panels 11 of the bottom module 10, each of the top solar battery panels 61 includes a first terminal 63 and a second terminal 64. The first terminal 63 and the second terminal 64 are provided on a front surface of the top solar battery panel 61. The first terminal 63 and the second terminal 64 are provided at positions not overlapping the solar battery cell 12 of the bottom module 10 in the plan view.

The pair of top solar battery panels 61 are connected to in series via an inter-panel connector 71. The inter-panel connector 71 is formed using a metal plate. The inter-panel connector 71 is connected to the first terminal 63 of one top solar battery panel 61 and the second terminal 64 of the other top solar battery panel 61. The constitution of the inter-panel connector 71 is not particularly limited. For example, it may be similar to that of the inter-panel connector 21 of the bottom module 10. Although it is not illustrated, a flexible substrate is connected to the top module 60. The flexible substrate is directly or indirectly connected to the top solar battery panels 61 and has a function similar to that of the flexible substrate 30 of the bottom module 10. The flexible substrate forms bypass lines and output lines of the pair of top solar battery panels 61.

As illustrated in FIGS. 1 and 2, the package 80 accommodates the pair of bottom solar battery panels 11 in their entirety in the bottom module 10 and the pair of top solar battery panels 61 in their entirety in the top module 60. The package 80 accommodates a great part of the flexible substrate 30 excluding parts in the vicinity of the respective terminals 44. Specifically, the package 80 accommodates at least all of the flying leads 40 in the flexible substrate 30. The package 80 is formed such that the pair of terminals 44 of the flexible substrate 30 are positioned on the outward side of the package 80. The package 80 includes a front cover 81, a back cover 82, and a sealing material 83.

The front cover 81 is a plate member formed of a transparent resin material, a glass, or the like. The front cover 81 is disposed on the front side of the bottom module 10 and the top module 60. The front cover 81 has a rectangular shape in which a pair of sides extend in the X direction and the remaining pair of sides extend in the Y direction in the plan view. The front cover 81 is disposed so as to overlap the entire pair of bottom solar battery panels 11 and the entire pair of top solar battery panels 61 in the plan view. The front cover 81 is disposed so as to overlap the entire part of the flexible substrate 30 excluding parts in the vicinity of the respective terminals 44 in the plan view.

The back cover 82 is a plate member formed of a resin material, a glass, or the like. The back cover 82 is disposed on the rear side of the bottom module 10 and the top module 60. The back cover 82 has the same shape and the same size as the front cover 81 in the plan view. The back cover 82 is disposed so as to completely overlap the front cover 81 in the plan view. The sealing material 83 is formed of a transparent resin material. The sealing material 83 thoroughly fills a space between the front cover 81 and the back cover 82.

As described above, the bottom module 10 according to the present embodiment includes the flexible substrate 30 on which the bypass diodes 51 are mounted and which forms the bypass lines of the bottom solar battery panels 11. According to this constitution, disposition of the bypass diodes with respect to a junction box and installation of a bus bar for connecting the solar battery panels and the junction box to each other can be omitted. Therefore, weight reduction of the bottom module 10 can be achieved.

For instance, when the bypass lines are formed using a bus bar, a member for supporting a disconnection portion connecting the bypass diodes is required separately. For this reason, in addition to increase in weight caused by using a heavy bus bar compared to a flexible substrate, the weight corresponding to the member supporting the disconnection portion further increases. According to the present embodiment, since the bypass diodes 51 are mounted on the flexible substrate 30, the dividing portion 52 of the wiring 31 can be supported by the base material 46 of the flexible substrate 30. Therefore, compared to when the bypass lines are formed using a bus bar, weight reduction of the bottom module 10 can be achieved.

The wiring 31 of the flexible substrate 30 includes the flying leads 40 connected to the bottom solar battery panels 11, and the terminals 44 provided on the outward side of the package 80. According to this constitution, the output lines of the bottom module 10 can be formed at parts between the flying leads 40 and the terminals 44 in the wiring 31. For this reason, the number of components can be reduced compared to when the output lines are formed using a member different from the flexible substrate.

The wiring 31 of the flexible substrate 30 forms the output lines branching from the bypass line. According to this constitution, the bypass lines of the bottom solar battery panels 11 and the output lines of the bottom module 10 are formed using a single flexible substrate 30. For this reason, the number of components can be reduced compared to when the output lines are formed using a member different from the flexible substrate.

The flexible substrate 30 has the plurality of flying leads 40 connected to the pair of bottom solar battery panels 11. According to this constitution, the bypass lines for each of the pair of bottom solar battery panels 11 are formed using a single flexible substrate 30. For this reason, the number of components can be reduced compared to a constitution in which a flexible substrate is provided one each in each of the pair of bottom solar battery panels 11.

The flexible substrate 30 includes the reinforcement members 48 joined to the mounting portions 50 of the bypass diodes 51. According to this constitution, deterioration in strength of the flexible substrate 30 in the mounting portions 50 can be curbed.

The bottom module 10 includes the inter-panel connector 21 connected to the pair of bottom solar battery panels 11. The flexible substrate 30 is connected to the pair of bottom solar battery panels 11 via the inter-panel connector 21. According to this constitution, the flexible substrate 30 can be connected to both the pair of bottom solar battery panels 11 via the inter-panel connector 21. For this reason, the wiring 31 of the flexible substrate 30 can be shortened compared to a constitution in which the flexible substrate is separately connected to the pair of bottom solar battery panels. Thus, the flexible substrate 30 can be formed at low costs.

The top solar battery panels 61 overlap the bottom solar battery panels 11 of the bottom module 10 in their entirety in the plan view. According to this constitution, occurrence of shadows in the solar battery cells 12 formed in the bottom solar battery panels 11 due to the wiring or the like around the solar battery cells 62 can be curbed. Therefore, increase in output of the bottom module 10 can be achieved.

In the foregoing embodiment, each of the flying leads 40 extends from the wiring main body 32 with a uniform width. However, the shapes of the flying leads 40 are not limited thereto. For example, the flying leads may be formed to be able to extend and contract. Hereinafter, an example of a structure allowing the flying leads to extend and contract will be specifically described in detail.

Figure 8:
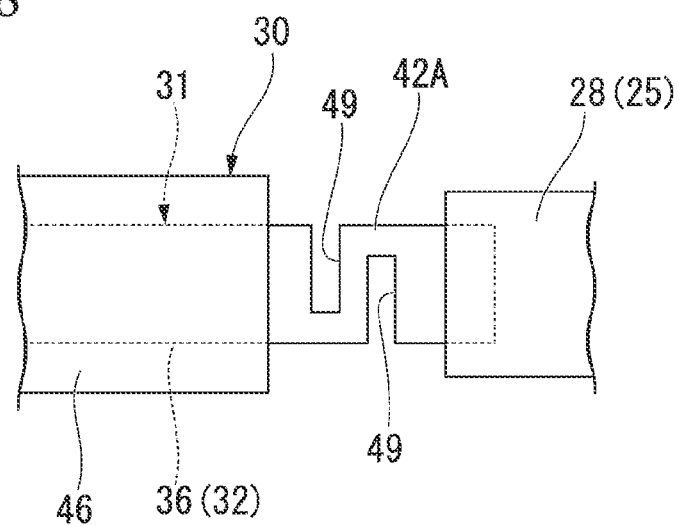
FIG. 8 is a plan view illustrating a flying lead according to a modification example of the embodiment.

FIG. 8 is a plan view illustrating a flying lead according to a modification example of the embodiment.

As illustrated in FIG. 8, cutouts 49 are formed at side edges of a second lead portion 42A. The cutouts 49 are formed at both side edges of the second lead portion 42A. A plurality of cutouts 49 are formed at positions displaced from each other in an extending direction of the second lead portion 42A. The second lead portion 42A is joined to the panel end connector 25 at a place on a tip side of the plurality of cutouts 49. The structure described above is applied to not only the second lead portion 42A but may also be applied to the first lead portion.

According to this constitution, positional misalignment between the flexible substrate 30 and the bottom solar battery panels 11 caused by the difference between coefficients of thermal expansion of the flexible substrate 30 and the bottom solar battery panels 11 can be absorbed by the second lead portions 42A which extend and contract. For this reason, in at least any one of joint portions between the panel end connectors 25 and the second lead portions 42A and joint portions between the panel end connectors 25 and the bottom solar battery panels 11, occurrence of stress caused by temperature change can be curbed, and a structure of connecting the flexible substrate 30 and the bottom solar battery panels 11 to each other can have a high strength.

In the description above, operational effects mainly related to the bottom module 10 have been described. However, the top module 60 also exhibits similar operational effects.

In addition, in the foregoing embodiment, the flexible substrate 30 is indirectly connected to the bottom solar battery panels 11 via the inter-panel connector 21 and the panel end connectors 25. However, the flexible substrate 30 may be directly connected to the bottom solar battery panels 11. That is, the flying leads 40 may be directly joined to at least any one of the first terminals 13 and the second terminals 14 of the bottom solar battery panels 11.

In addition, in the foregoing embodiment, the bottom module 10 has the pair of bottom solar battery panels 11. However, the constitution of the bottom module is not limited thereto. The bottom module may have a single bottom solar battery panel or may have three or more bottom solar battery panels. The same applies to the top module.

In addition, in the foregoing embodiment, a single flexible substrate 30 is connected to both the pair of bottom solar battery panels 11. However, a flexible substrate may be connected to each of the pair of bottom solar battery panels 11 one each.

According to at least one embodiment described above, the bottom module has a flexible substrate on which bypass diodes are mounted and which forms bypass lines of the bottom solar battery panels. According to this constitution, disposition of the bypass diodes with respect to the junction box and installation of a bus bar for connecting the bottom solar battery panels and the junction box to each other can be omitted. Therefore, weight reduction of the bottom module can be achieved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A tandem solar battery comprising:
   a pair of solar battery modules each of which has
      at least one solar battery panel in which a solar battery cell is formed,
      a flexible substrate which is directly or indirectly connected to the at least one solar battery panel, on which a bypass diode is mounted, and which forms a bypass line of the at least one solar battery panel, and
      a package which accommodates the at least one solar battery panel,
   wherein the flexible substrate includes
      a base material, and
      a wiring which is supported by the base material,
   wherein the wiring includes
      a flying lead which protrudes from the base material and is connected to the at least one solar battery panel, and
      a terminal which is provided on an outward side of the package,
   wherein the pair of solar battery modules include a first solar battery module and a second solar battery module,
   wherein the at least one solar battery panel of the first solar battery module includes a bottom solar battery panel,
   wherein the at least one solar battery panel of the second solar battery module includes a top solar battery panel which is laminated at a position facing a light receiving surface of the bottom solar battery panel, and
   wherein the top solar battery panel is larger than the bottom solar battery panel and overlaps the bottom solar battery panel in its entirety in a plan view.

2. The tandem solar battery according to claim 1,
   wherein the flexible substrate includes a reinforcement member which is joined to the base material, and
   wherein the reinforcement member is disposed at a position overlapping a mounting portion of the bypass diode.

3. The tandem solar battery according to claim 1,
   wherein the at least one solar battery panel includes a first solar battery panel and a second solar battery panel which are connected to each other in series,
   wherein the solar battery module further comprises an inter-panel connector which is connected to the first solar battery panel and the second solar battery panel, and
   wherein the flexible substrate is connected to the first solar battery panel and the second solar battery panel via the inter-panel connector.

4. The tandem solar battery according to claim 1,
   wherein the bypass diode is positioned on the outward side of the at least one solar battery panel in the plan view.

5. The tandem solar battery according to claim 1,
   wherein the wiring includes a dividing portion that separates sections of a main line portion of the wiring from one another, and
   wherein the bypass diode is arranged across the dividing portion, and is connected to both of the sections sandwiching the dividing portion in the wiring.

6. The tandem solar battery according to claim 1,
wherein the bypass diode is positioned on the outward side of the at least one solar battery panel in a first direction in the plan view,
wherein the wiring extends from the bypass diode in a second direction orthogonal to the first direction in plan view.

\* \* \* \* \*